United States Patent [19]

Takiguchi et al.

[11] Patent Number: 5,315,165
[45] Date of Patent: May 24, 1994

[54] OUTPUT CIRCUIT FOR OUTPUTTING CONTROL SIGNAL TO CONTROLLED APPARATUS

[75] Inventors: Masahiro Takiguchi; Masahiro Kamiya, both of Anjyo, Japan

[73] Assignee: Nippondenso Co., Ltd., Kariya, Japan

[21] Appl. No.: 921,633

[22] Filed: Jul. 30, 1992

[30] Foreign Application Priority Data

Jul. 30, 1991 [JP] Japan .................. 3-190155

[51] Int. Cl.$^5$ ..................... H03K 3/01; H03K 3/42
[52] U.S. Cl. ..................... 307/296.1; 307/296.6; 307/311
[58] Field of Search ............ 307/311, 296.1, 296.6

[56] References Cited

U.S. PATENT DOCUMENTS

| | | | |
|---|---|---|---|
| 4,647,794 | 3/1987 | Guajardo | 307/311 |
| 4,682,061 | 7/1987 | Donovan | 307/311 |
| 5,068,545 | 11/1991 | Molnar | 307/270 |
| 5,089,948 | 2/1992 | Brown et al. | 307/311 |
| 5,111,070 | 5/1992 | Murphy et al. | 307/311 |
| 5,175,487 | 12/1992 | Inoue | 307/311 |
| 5,189,307 | 2/1993 | Fabian | 307/311 |

Primary Examiner—William L. Sikes
Assistant Examiner—Trong Phan
Attorney, Agent, or Firm—Cushman, Darby & Cushman

[57] ABSTRACT

An output circuit for outputting a control signal through a transistor to a controlled apparatus including an output detecting section for detecting the control signal and an external power supply for supplying a power to the output detecting section, a voltage due to the external power supply being applied to between a collector and emitter. The output circuit comprises a capacitor coupled in parallel to an output detecting circuit comprising the output detecting section and the transistor coupled in series to each other and resistor means coupled in series to a parallel circuit comprising the output detecting circuit and the capacitor so as to give a series resistance with respect to the parallel circuit. The output circuit further comprises a switch disposed to be parallel to the resistor for bypassing the resistor to substantially reduce the series resistance up to zero when a voltage between terminals of the capacitor is above a predetermined value. This arrangement can prevent the transistor from instantaneously taking the ON state, thereafter ensuring the normal operation by bypassing the resistor means through the switch.

10 Claims, 8 Drawing Sheets

OUTPUT CIRCUIT FOR OUTPUTTING CONTROL SIGNAL TO CONTROLLED APPARATUS

BACKGROUND OF THE INVENTION

The present invention relates to an output circuit for outputting a control signal to an apparatus to be controlled in accordance with the control signal.

FIGS. 8 and 9 are block diagram showing conventional output circuits. In FIG. 8, the output circuit, designated at numeral 1100 is of a source output type comprising an internal circuit 1102 for outputting a control result and a photo-coupler 1104. A controlled apparatus 1106 to be coupled to the output circuit 1100 is equipped with an external power supply 1108 and an output detecting section 1109. Further, the photo-coupler 1104 comprises an LED 1104A and an output transistor 1104B. With this arrangement, when the photo-coupler 1104 takes an ON state, a current flows through the output detecting section 1109 whereby the operating state of the internal circuit 1102 is detectable at the controlled circuit 1106 side. On the other hand, an output circuit 1200 illustrated in FIG. 9 is of a sink output type comprising an internal circuit 1202 for outputting a control result and a photo-coupler 1204. A controlled apparatus 1206 to be coupled to the output circuit 1200 includes an external power supply 1208 and an output detecting section 1209. The photo-coupler 1204 comprises an LED 1204A and an output transistor 1204B.

There is a problem which arises with the conventional output circuit 1100 or 1200, however, in that, when coupling the output circuit 1100 or 1200 to the controlled apparatus 1106 or 1206, or when turning on the external power supply 1108 or 1208, the output transistor 1104B or 1204B momentarily takes the ON state so that an error output occurs. Thus, there is the possibility that the controlled apparatus 1106 or 1206 malfunctions. This is because, when a rapidly rising voltage is applied to between the collector and emitter of the output transistor 1104B or 1204B, a current passes through a junction capacity portion C1 between the collector and base of the transistor 1104B or 1204B (such as illustrated in FIG. 9) and hence the output transistor 1104B or 1204B instantaneously takes the ON state. In other words, this is due to the so-called flash-on phenomenon.

SUMMARY OF THE INVENTION

It is therefore an object of the present invention to provide an output circuit which is capable of preventing the error output from occurring due to the flash-on phenomenon when coupling the output circuit to the controlled apparatus 1106 or 1206, or when turning on the external power supply.

According to this invention, an output circuit comprises transistor means to output a control signal through the transistor means to a controlled apparatus including an output detecting section for detecting the control signal and an external power supply for supplying a power to the output detecting section wherein a voltage due to the external power supply is supplied to between a collector and emitter or a drain and source of the transistor means, and further comprises a capacitor coupled in parallel to an output detecting circuit comprising the output detecting section and the transistor means coupled in series to each other and resistor means coupled in series to a parallel circuit comprising the output detecting circuit and the capacitor so as to give a series resistance with respect to the parallel circuit. With this arrangement, the voltage applied to the transistor means is gradually increased by the capacitor and resistor means.

Preferably, the output circuit further comprises resistance reducing means disposed to be parallel to the resistor means for substantially reducing the series resistance of the resistor means up to zero when a voltage between terminals of said capacitor is above a predetermined value. The resistance reducing means is constructed with switching means which takes an ON state when the voltage between the terminals of the capacitor means is above the predetermined value, whereby the voltage due to the external power supply can directly be applied to the transistor means.

In the output circuit according to this invention thus arranged, at the time of starting the power supply from the external power supply, most of the voltage is developed across the resistor means but not developed across the capacitor, thereby preventing a rapidly rising voltage from being applied to the transistor means. With the passage of time from the power supply, the capacitor is charged so that the voltage across the capacitor gradually increases and a voltage to be applied to the transistor means also gradually increases. When the voltage across the capacitor reaches a predetermined value, the resistance reducing means bypasses the resistor means whereby the voltage due to the external power supply is directly applied to the transistor means. This arrangement can prevent the transistor means from instantaneously becoming the ON state when turning on the external power supply, thereafter ensuring the normal operation by removing the resistor means through the resistance reducing means.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
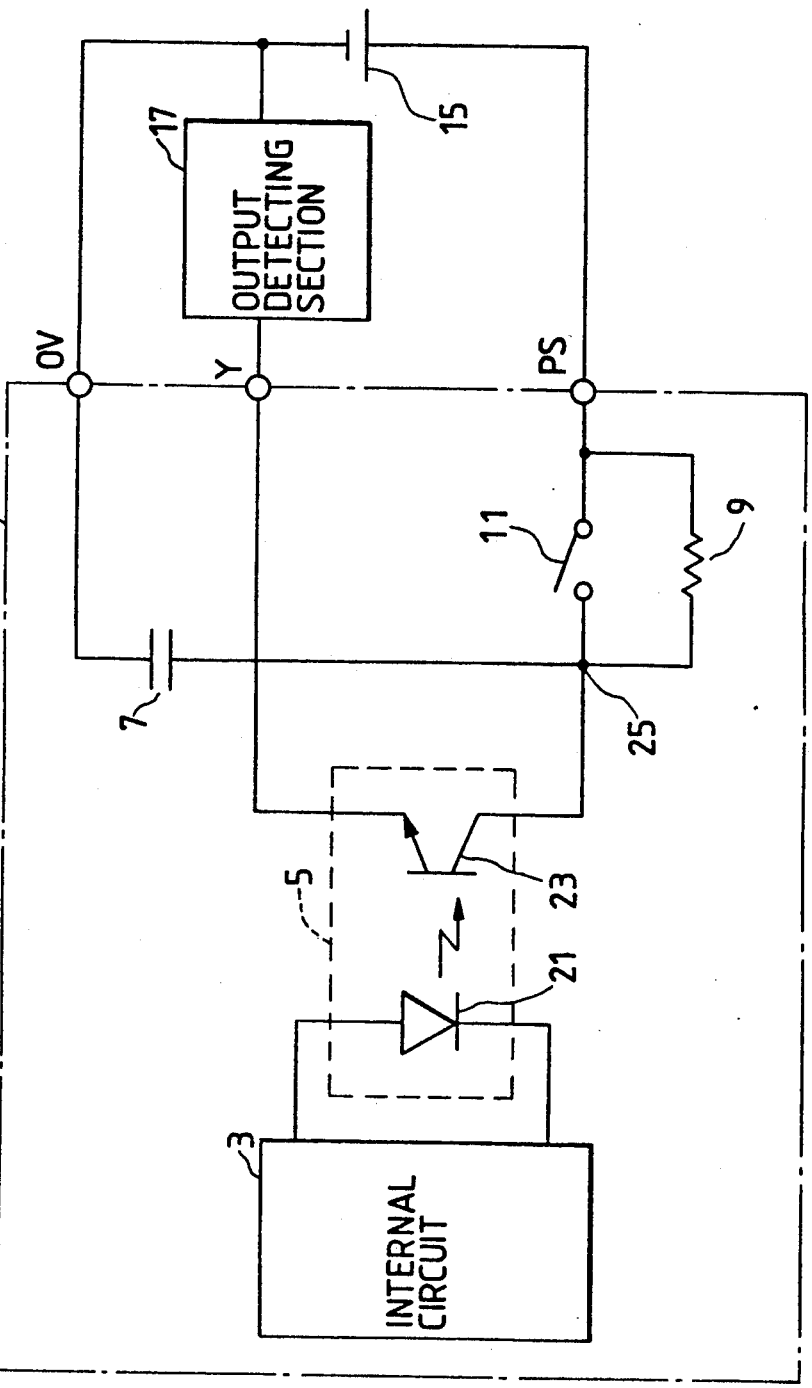
FIG. 1 is a block diagram showing an arrangement of an output circuit according to a first embodiment of the present invention.

FIG. 1 shows an arrangement of an output circuit of a programmable controller. The output circuit, designated at numeral 1, is of a source output type comprising an internal circuit 3, a photo-coupler 5, a capacitor 7, a resistor 9, a switch 11, and output terminals Y, PS, 0V. To the output circuit 1 there are coupled an output detecting section 17 and an external power supply 15 of a controlled apparatus. The internal circuit 3 is constructed with a microcomputer or the like, and the photo-coupler 5 is equipped with an LED 21 and a phototransistor 23. The internal circuit 3 is connected to the LED 21 to apply a current to the LED 21 to emit light, thereby ON-controlling the controlled apparatus. The phototransistor 23 has its emitter connected to the output terminal Y and at its collector connected to one terminal of the capacitor 7, one terminal of the resistor 9 and one terminal of the switch 11. The other terminal of the capacitor 7 is connected to the output terminal 0V, the other terminal of the resistor 9 is connected to the output terminal PS, where the other terminal of the switch 11 is also connected to the output terminal PS. The output terminal PS is connected to the positive side of the external power supply 15, and the output terminal Y is connected to one terminal of the output detecting section 17. The other terminal of the output detecting section 17 and the output terminal 0V are connected to the minus side of the external power supply 15.

When the output circuit 1 takes the normal state, in response to the internal circuit 3 supplying a current to the LED 21, the phototransistor 23 takes the ON state to supply a current to the output detecting section 17, whereby the output detecting section 17 detects the ON control due to the output circuit 1.

Secondly, a description will be made in terms of an operation carried out when turning on the external power supply 15. Before turning on the external power supply 15, the switch 11 is in the OFF state. At the time of turning on the external power supply 15, the power from the external power supply 15 is directly applied to a series circuit comprising the capacitor 7 and the resistor 9, and the electric potential at junction point 25 between capacitor 7 and resistor 9 substantially becomes equal to the electric potential at the minus side of the external power supply 15, i.e., 0V electric potential. Further, the emitter of the phototransistor 23, which is coupled through the output detecting section 17 to the minus side of the external power supply 15, takes 0V electric potential when the phototransistor 23 is in the OFF state. Accordingly, the voltage between the collector and emitter of the phototransistor 23 substantially becomes 0 (V) at the time of turning on the external power supply 15.

After turning on the external power supply 15, the capacitor 7 is charged with the passage of time so that the electric potential at the junction point 25 is gradually heightened up to the voltage at the plus side terminal of the external power supply 15. Thus, after the turning-on of the external power supply 15, the voltage between the collector and emitter of the phototransistor 23 gradually increases from 0 (V) up to the external power supply 15 voltage. As a result, the rapidly rising voltage variation can be prevented from being applied to the phototransistor 23, thereby preventing the occurrence of the flash-on phenomenon. In addition, since the current flowing through the capacitor 7 is directly obtained from the external power supply 15 without passing through the output detecting section 17, the malfunction of the controlled apparatus due to the charging current for the capacitor 7 does not occur.

The increasing state of the voltage V between the collector and emitter, i.e., the inclination dV/dt of the voltage variation, is appropriately adjusted by means of the capacity of the capacitor 7 and the resistance value of the resistor 9. Since the output circuit 1 is shifted to the normal state after the completion of the charging of the capacitor 7, the switch 11 is set on the ON state, whereby the resistor 9 is bypassed to cause the output circuit 1 to normally operate.

Figure 2:
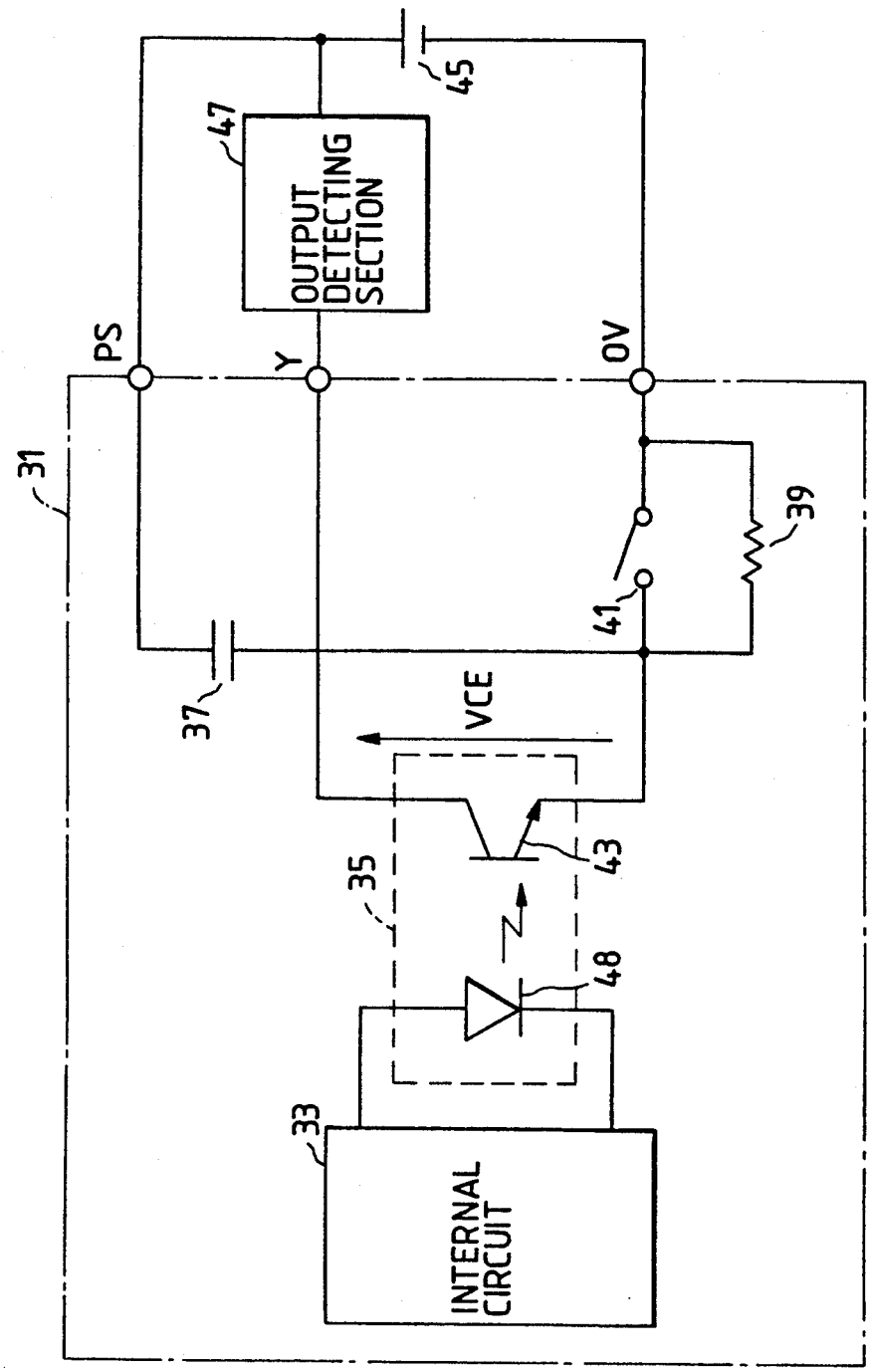
FIG. 2 is a modification of the first embodiment of this invention.

In addition, a description will be made hereinbelow in terms of a modification of the above-described first embodiment of this invention. FIG. 2 is a block diagram showing an arrangement of an output circuit 31. In FIG. 2, the output circuit 31 is of a sink output type comprising an internal circuit 33, a photo-coupler 35, a capacitor 37, a resistor 39, a switch 41, and output terminals Y, PS, OV. To the output-circuit 31 there are coupled an output detecting section 47 and an external power supply 45 of a controlled apparatus. The photo-coupler 35 is equipped with an LED 48 and a phototransistor 43. Further, the phototransistor 43 is at its collector coupled to the output terminal Y and at its emitted to the capacitor 37, resistor 39 and switch 41. The capacitor 37 is at its other terminal connected to the output terminal PS, the resistor 39 is at its other terminal connected to the output terminal 0 V, and the switch 41 is at its other terminal connected to the output terminal 0 V. The output terminal PS is connected to the plus side of the external power supply 45, the output terminal Y is coupled through the output detecting section 47 to the plus side of the external power supply 45, and the output terminal 0 V is connected to the minus side of the external power supply 45.

Secondly, a description will be made in terms of an operation carried out when turning on the external power supply 45. In this modification, the emitter potential of the phototransistor 43 substantially becomes equal to the plus side potential of the external power supply 45 at the time of turning on the external power supply 45, and in accordance with the capacitor 37 being charged, the emitter potential thereof gradually decreases up to 0 V potential. Thus, at the time of turning on the external power supply 45, both the potentials of the collector and emitter of the phototransistor 43 substantially become equal to the plus side potential of the external power supply 45. As a result, as well as the first embodiment, the voltage VCE between the collector and emitter thereof gradually increases from 0 (V) after turning on the external power supply 45, thus preventing the occurrence of the flash-on phenomenon in the phototransistor 43.

Figure 3:
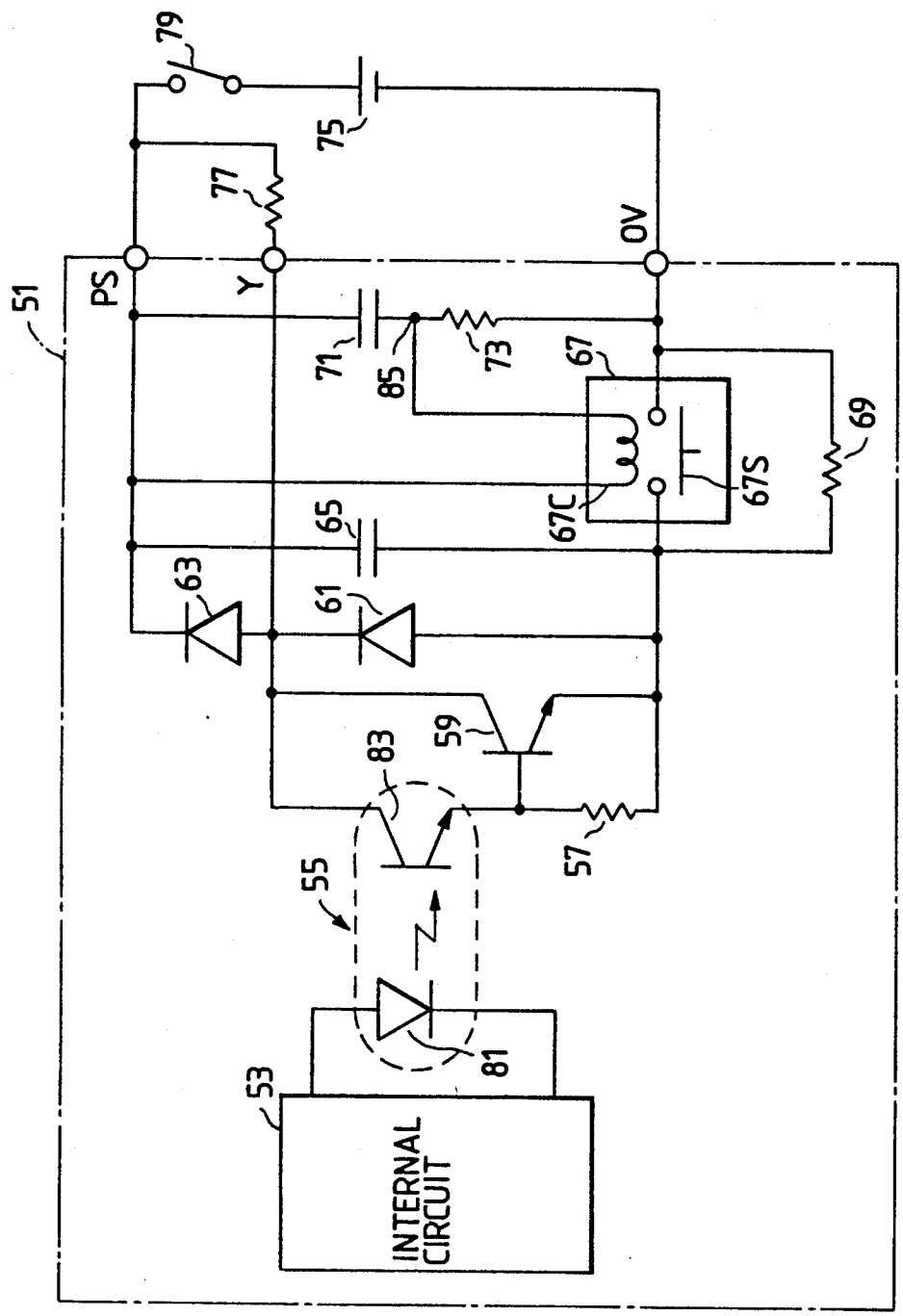
FIG. 3 is a block diagram showing an arrangement of an output circuit according to a second embodiment of this invention.

Further, a description will be made hereinbelow in terms of a second embodiment of this invention. FIG. 3 is a block diagram showing an arrangement of an output circuit 51 according to this second embodiment. In FIG. 3, the output circuit 51 is provided with an internal circuit 53, a photo-coupler 55, a resistor 57, a transistor 59, diodes 61, 63, a capacitor 65, a relay 67, a resistor 69, a capacitor 71, a resistor 73 and output terminals Y, PS, 0 V. To the output circuit 51 there are coupled a resistor 77, a switch 79 and an external power supply 75 which is a controlled apparatus. The photo-coupled 55 includes an LED 81 and a phototransistor 83. The phototransistor 83 is at its collector connected to the output terminal Y and at its emitter connected through the resistor 57 and an A contact 67S of the relay 67 to the output terminal 0 V. The resistor 57 is a base resistor for preventing the output due to the leakage current and is coupled to the base of the transistor 59. The transistor 59 is for the output amplification and is at its collector connected to the output terminal Y and at its emitted connected through the A contact 67S of the relay 67 to the output terminal 0 V. Further, the diodes 61 and 63 are for protecting the circuit.

One terminal of the capacitor 65 is connected to the output terminal PS and the other terminal thereof is coupled through the A contact 67S of the relay 67 to the output terminal 0 V. The bypass resistor 69 is disposed parallel with respect to the A contact 67A thereof. A coil 67C of the relay 67 is at its one terminal connected to the output terminal PS and at its other terminal connected to a junction point 85 between the capacitor 71 and the resistor 73. The other terminal of the capacitor 71 is connected to the output terminal PS and the other terminal of the resistor 73 is connected to the output terminal 0 V. The plus side of the external power supply 75 is coupled through the switch 79 to the output terminal PS, and the minus side thereof is coupled to the output terminal 0 V. The resistor 77 is connected between the output terminals PS and Y.

Figure 4A:
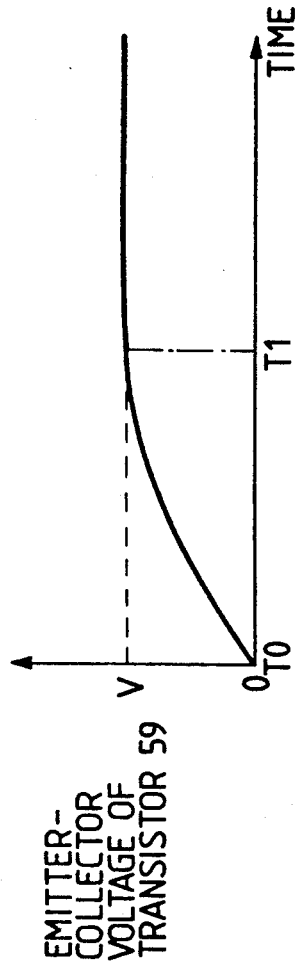
FIGS. 4(a)–(c) is a timing chart for describing an operation of the output circuit according to the second embodiment.
Figure 4B:
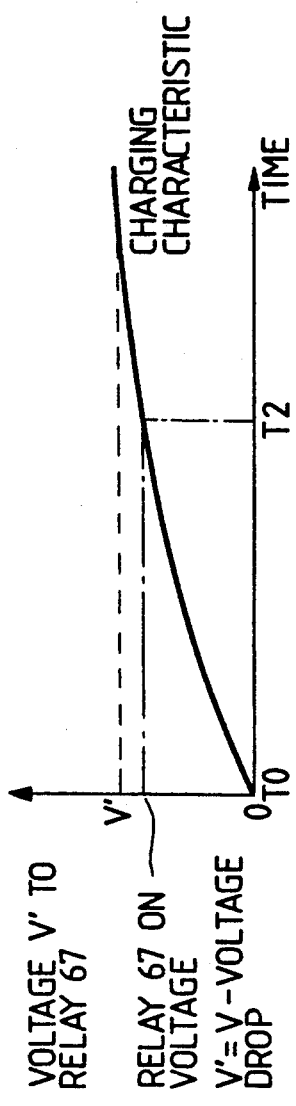
Figure 4C:
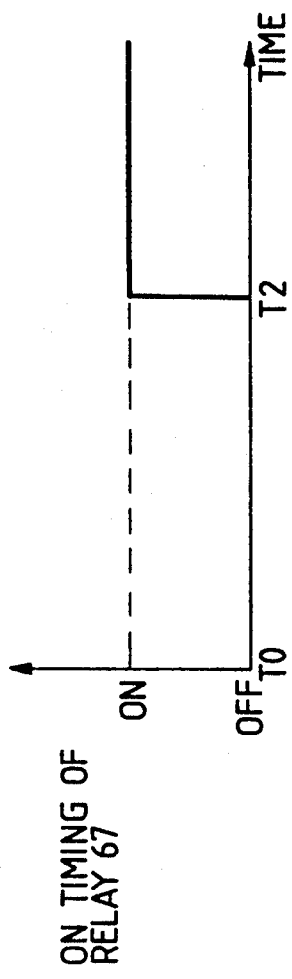

Further, a description will be made with reference to FIG. 4 in terms of the operation of the output circuit 51. In FIG. 4, (a) shows the collector-emitter voltage waveform of the transistor 59, (b) shows the voltage waveform to be applied to the coil 67C of the relay 67, and (c) illustrates the ON-timing of the relay 67. In the output circuit 51, in response to turning on the external power supply 75 (having a voltage V) at the time T0, the voltage between the collector and emitter of the transistor 59 increases from the time T0 as indicated by (a). The collector-emitter voltage is determined on the basis of the charging characteristic of the capacitor 65 and the resistor 69 and substantially reaches the voltage V at the time T1. The voltage V' (=V−the voltage drop at the resistor 73) to be applied to the coil 67C of the relay 67 is determined on the basis of the charging characteristic of the capacitor 71 and the resistor 73. As indicated by (b), the voltage V' reaches the ON-voltage of the relay 67 at the time T2. Thus, as indicated by (c), the relay 67 is switched from the OFF state to the ON stage at the time T2. Here, the charging characteristic of the capacitor 71 is set so that the voltage at the time T2 becomes higher than the voltage at the time T1. Thus, the rate of change of the voltage to be applied to between the collector and emitter of the transistors 83 and 59 can be set to be below a predetermined value, and in addition the resistor 69 which gets through the duty can be bypassed by the relay 67 at an appropriate timing.

Figure 5:
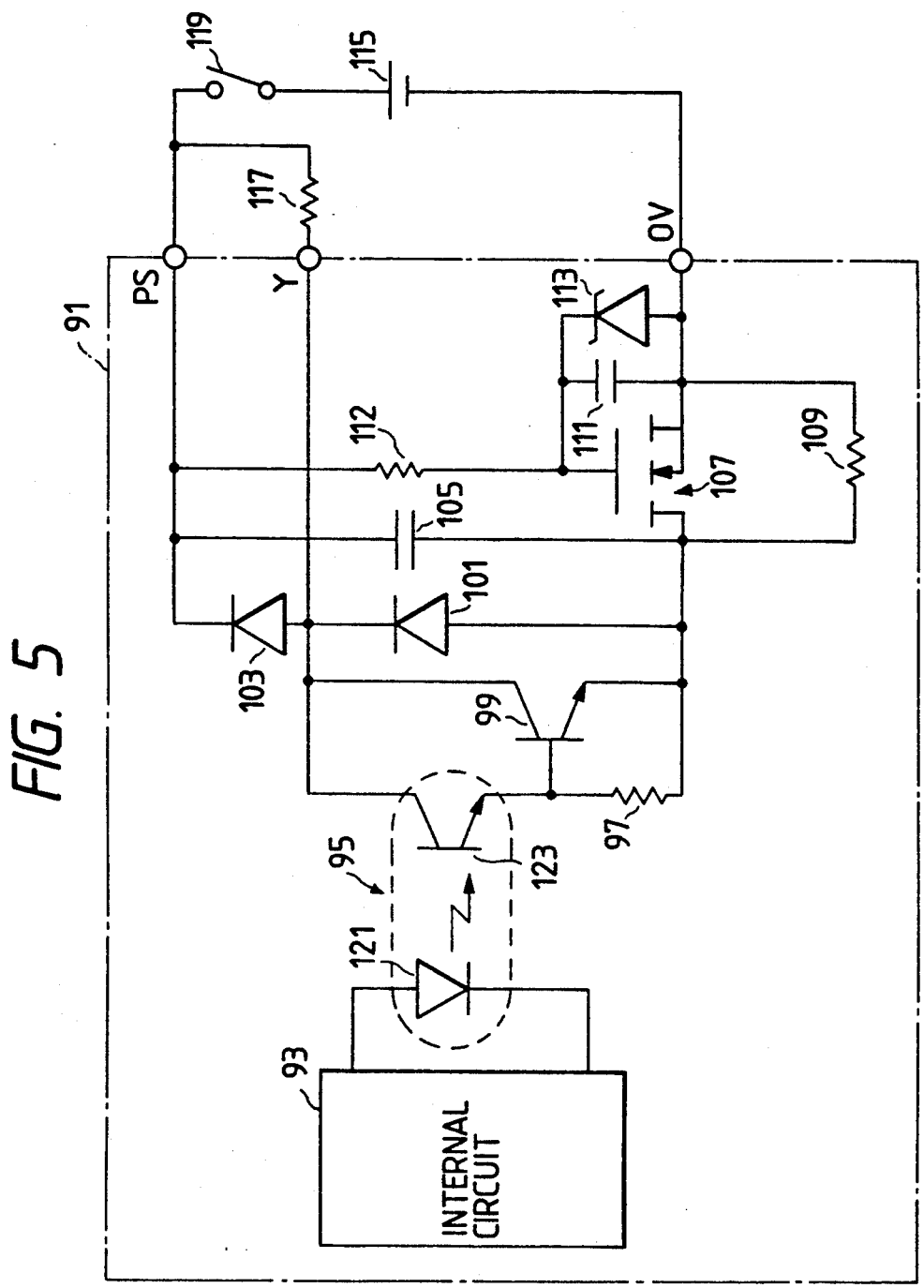
FIG. 5 is a block diagram showing an arrangement of an output circuit according to a third embodiment of this invention.

Moreover, a description will be made hereinbelow in terms of a third embodiment of this invention. FIG. 5 is a block diagram showing an arrangement of an output circuit 91 according to the third embodiment. In FIG. 5, the output circuit 91 is equipped with an internal circuit 93, a photo-coupler 95, a resistor 97, a transistor 99, diodes 101, 103, a capacitor 105, an FET 107, a resistor 109, a capacitor 111, a resistor 112, a Zener diode 113 and output terminals Y, PS, 0 V. To the output circuit 91 there are coupled a resistor 117, a switch 119 and an external power supply 115 which is the controlled apparatus. The photo-coupler 95 is provided with an LED 121 and a phototransistor 123. Here, the arrangement of the output circuit 91 according to the third embodiment is substantially similar to the above-described arrangement of the output circuit 51 according to the second embodiment except for the FET 107, capacitor 111, resistor 112 and Zener diode 113.

The FET 107 is for bypassing the resistor 109 and the gate of the FET 107 is coupled to the resistor 112, capacitor 111 and Zener diode 113. The resistor 112 and the capacitor 111 are for adjusting the ON-timing of the FET 107, and the Zener diode 113 is for guarding the FET 107.

Figure 6A:
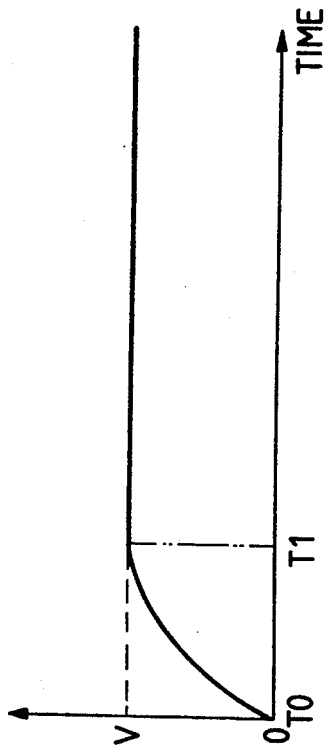
FIGS. 6(a)–(c) is a timing chart for describing an operation of the output circuit according to the third embodiment.
Figure 6B:
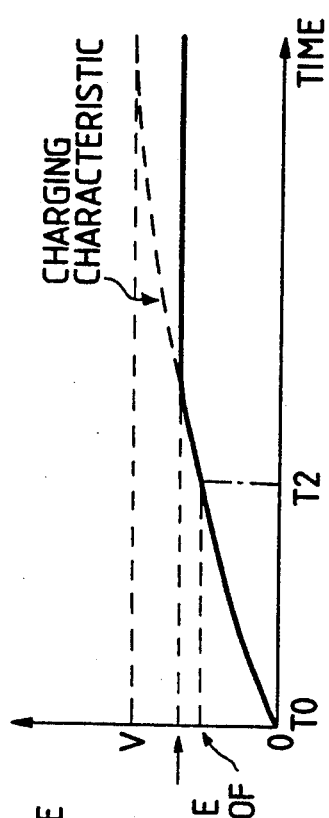
Figure 6C:
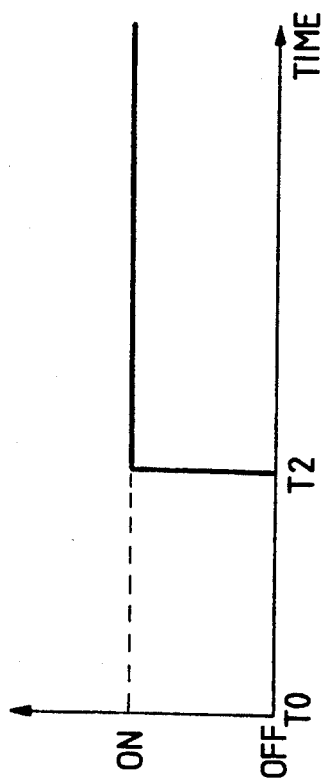

Secondly, the operation of the output circuit 91 will be described hereinbelow with reference to FIG. 6. In FIG. 6, (a) indicates the collector-emitter voltage waveform of the transistor 99, (b) indicates the gate-source voltage waveform of the FET 107, and (c) indicates the ON-timing of the FET 107. In the output circuit 91, in response to turning on the external power supply 115 having a voltage V, the voltage between the collector and emitter of the transistor 99 increases from the power supply turning-on time T0 as indicated in (a). The collector-emitter voltage is determined on the basis of the charging characteristic of the capacitor 105 and the resistor 109. The collector-emitter voltage substantially reaches the voltage V at the time T1.

The variation state of a voltage to be applied to the gate of the FET 107 is determined on the basis of the charging characteristic of the capacitor 111 and the resistor 112, and the upper limit of the voltage is determined by means of the Zener voltage of the Zener diode 113. That is, as illustrated in (b) of FIG. 6, the voltage reaches the ON-voltage of the FET 107 at the time T2 and becomes constant after reaching the Zener voltage. Thus, as illustrated in (c) of FIG. 6, the FET 107 is switched from the OFF state to the ON state at the time T2. Here, the charging characteristic of the capacitor 111 is set so that the voltage at the time T2 is higher than the voltage at the time T1, whereby the rate of change of the voltage to be applied to between the collector and emitter of the transistors 123 and 99 can be set to be below a predetermined value and the resistor 109 which gets through the duty can be bypassed by means of the FET 107 at an appropriate timing.

Figure 7:
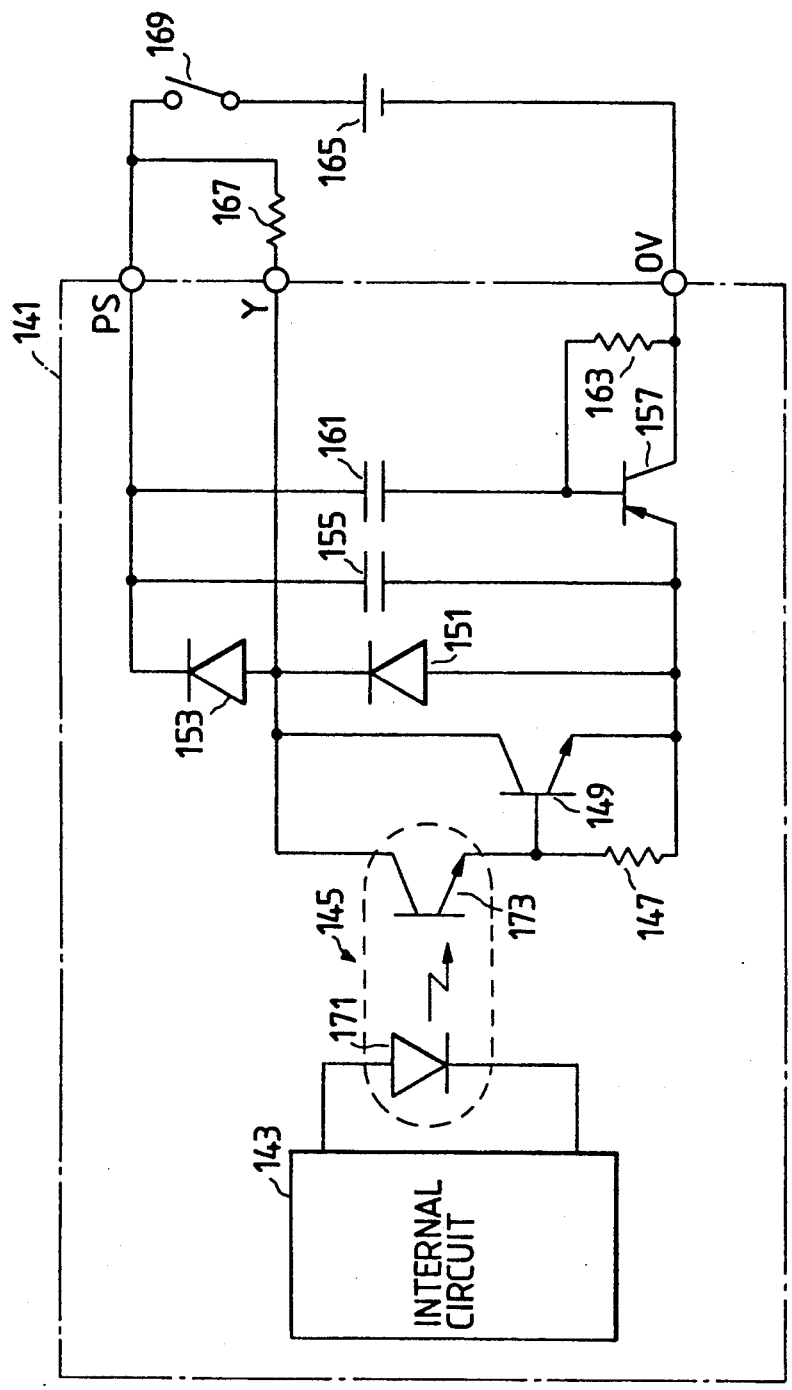
FIG. 7 is a block diagram showing an arrangement of an output circuit according to a fourth embodiment of this invention.
Figure 8:
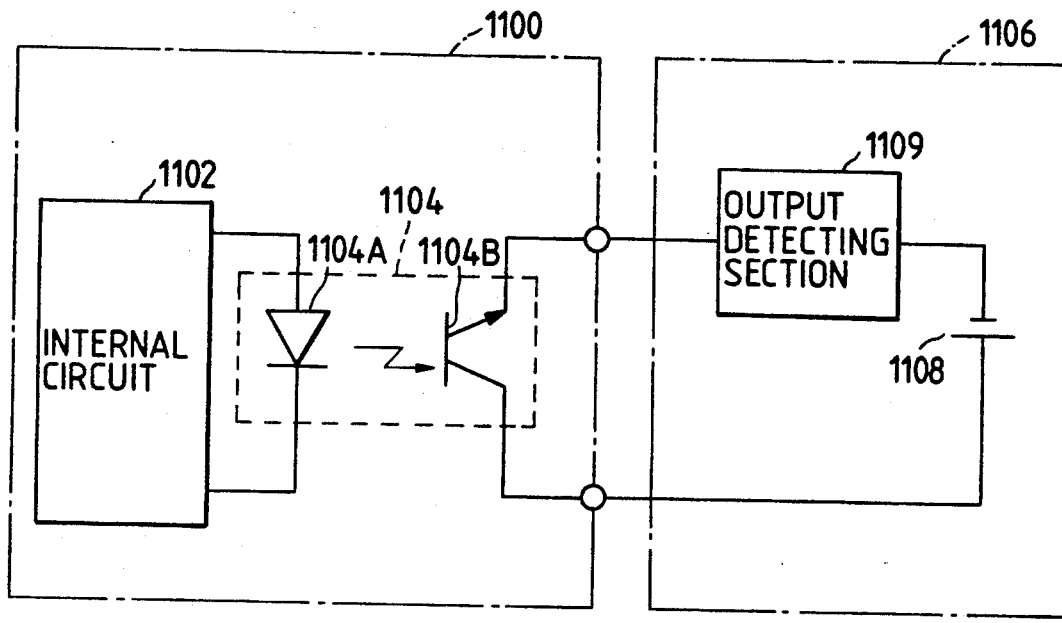
FIGS. 8 and 9 are block diagrams showing arrangements of conventional output circuits.
Figure 9:
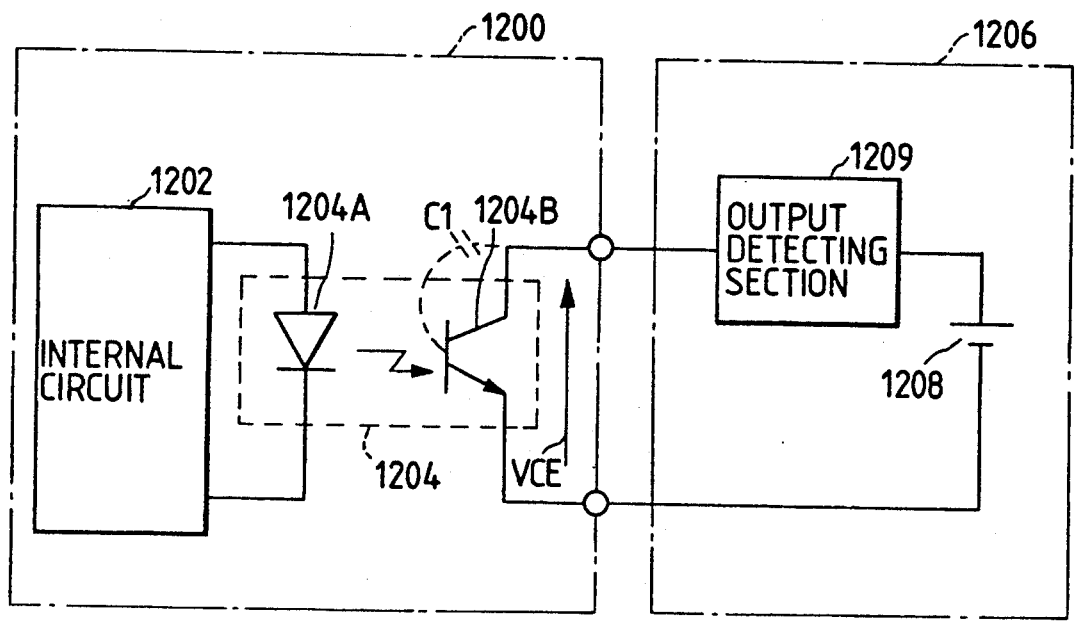

Still further, a description will be made hereinbelow in terms of a fourth embodiment of this invention. FIG. 7 is a block diagram showing an arrangement of an output circuit 141 according to the fourth embodiment. In FIG. 7, the output circuit 141 is provided with an internal circuit 143, a photo-coupler 145, a resistor 147, a transistor 149, diodes 151, 153, a capacitor 155, a transistor 157, a capacitor 161, a resistor 163 and output terminals Y, PS, 0 V. To the output circuit 141 there are coupled a resistor 167, a switch 169 and an external power supply 165 which is the controlled apparatus. The photo-coupler 145 comprises an LED 171 and a phototransistor 173. Here, the arrangement of the output circuit 141 according to this embodiment is substantially similar to the arrangement of the output circuit 51 according to the second embodiment except for the transistor 157. The transistor 157 is for performing the charging of the capacitor 155 and performing the bypassing after the charging of the capacitor 155.

Secondly, the operation of the output circuit 141 will be described hereinbelow. In the output circuit 141, since the transistor 157 is in the OFF state at the time T0 of turning on the external power supply 165 having a voltage V, the transistor 157 acts as a resistor having an extremely large resistance. After the time T0, in accordance with the capacitor 161 being charged by the resistor 163, the transistor 157 slowly takes the ON state. The transistor 157 acts as a resistor for charging the capacitor 155 in a non-saturation operating region to cause the collector-emitter voltage of the transistors 173 and 149 to slowly rise. After the completion of the charging of the capacitor 155, the transistor 157 takes the OFF state. In the normal state, the transistor 157 which is in the OFF state is switched from the OFF state to the ON state to normally operate in response to the turning-on of the transistors 173 and 149. Thus, it is possible that the rate of change of the voltage to be applied to between the collector and emitter of the transistors 173 and 149 can be set to be below a predetermined value.

In the control signal output circuit according to this invention, in response to the power from the external power supply, the voltage to be applied to the transistor gradually increases so as to prevent the occurrence of the instantaneous ON state. Further, after the completion of the operation for preventing the instantaneous ON state, the transistor operation is arranged so as not to be affected thereby. Thus, the output circuit can be coupled to the controlled apparatus without affecting the operation in the normal state, or the occurrence of the flash-on phenomenon, i.e., the instantaneous ON state, can be prevented when turning on the power supply of the controlled apparatus. As a result, it is possible to prevent the malfunctions of the control signal output circuit and the controlled apparatus.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. An output circuit for outputting a control signal to a controlled apparatus, said controlled apparatus having an output detecting section for detecting said control signal and an external power supply for supplying current to said output detecting section, said output circuit comprising:

transistor means for outputting said control signal to said controlled apparatus;
   a capacitor coupled to said external power supply and coupled in parallel to an output detecting circuit comprising said output detecting section and said transistor means coupled in series to each other;
   resistor means coupled to said external power supply and coupled in series to a parallel circuit comprising said output detecting circuit and said capacitor, said resistor means having a series resistance with respect to said parallel circuit for restricting instantaneous voltage development across said capacitor when power is initially supplied from said external power supply to prevent turn-on of said transistor means when power is initially supplied from said power supply; and
   resistance reducing means coupled in parallel with said resistor means for substantially reducing said series resistance of said resistor means when a voltage across said capacitor increases above a predetermined value which is determined by said capacitor and resistance means.

2. An output circuit as claimed in claim 1, further comprising indication means for detecting said voltage between said terminals of said capacitor to output an indication signal when said voltage between said terminals thereof is above said predetermined value, and wherein said resistance reducing means is responsive to said indication signal from said indication means to substantially reduce said series resistance of said resistor means to zero.

3. An output circuit as claimed in claim 2, wherein said resistance reducing means comprises switch means.

4. An output circuit as claimed in claim 2, wherein said resistance reducing means comprises and a switching capacitor and switching resistor means coupled in series and an FET having a gate connected to a connection point between said switching capacitor and said switching resistor means, wherein said switching capacitor, in cooperation with said switching resistor means, sets an ON timing of said FET for substantially reducing said series resistance of said resistor means.

5. An output circuit as claimed in claim 2, wherein said resistance reducing means comprises a switching transistor and is equipped with a switching capacitor connected in series to a base side of said switching transistor and switching resistor means is provided between said base side and a collector side of said switching transistor, wherein said switching capacitor, in cooperation with said switching resistor means, sets an ON timing of said switching transistor for substantially reducing said series resistance of said resistor means to zero.

6. An output circuit for outputting a control signal to a controlled apparatus, said output circuit being coupled to an external power supply, said output circuit comprising:

transistor means for providing said control signal to said controlled apparatus, where a voltage is applied from said external power supply across a pair of output terminals of said transistor;
   adjusting means including a capacitor and a resistor coupled to said external power supply and to said transistor for gradually increasing said voltage between said output terminals of said transistor means and for preventing instantaneous turn-on of said transistor means when said voltage is initially applied across said output terminals of said transistor means; and
   stopping means coupled with said adjusting means for stopping the operation of said adjusting means when said voltage across said output terminals of said transistor means increases above a predetermined value which is determined by said capacitor and resistor.

7. An output circuit for outputting a control signal to a controlled apparatus, said controlled apparatus including an output detecting section for detecting said control signal and an external power supply for supplying power to said output detecting section, said output circuit comprising:

transistor means for outputting said control signal to said controlled apparatus, where voltage produced by said external power supply is supplied to said transistor;
   a capacitor coupled to said external power supply in parallel with an output detecting circuit comprising said output detecting section and said transistor means coupled in series to each other; and
   resistor means coupled to said external power supply, said resistor means and external power supply being connected to a parallel circuit comprising said output detecting circuit and said capacitor, said resistor means having a series resistance with respect to said parallel circuit so that said voltage applied to said transistor means is gradually increased by said capacitor and resistor means after the start of supplying said power from said external power supply so that instantaneous turn-on of said transistor means is prevented when said power is initially supplied.

8. An output circuit as claimed in claim 7, further comprising resistance reducing means disposed to be parallel to said resistor means for substantially reducing said series resistance of said resistor means up to zero at a predetermined timing, where said predetermined timing is determined by said capacitor and resistor means.

9. An output circuit as claimed in claim 8, wherein said resistance reducing means substantially reduces said series resistance of said resistor means up to zero when a voltage between terminals of said capacitor is above a predetermined value determined by said capacitor and resistor means.

10. An output circuit as claimed in claim 9, wherein said resistance reducing means comprises switching means which takes an ON state when said voltage between said terminals of said capacitor means is above said predetermined value, whereby said voltage due to said external power supply is directly applied to said transistor means.

* * * * *